United States Patent

Hong

[11] Patent Number: 5,903,040
[45] Date of Patent: May 11, 1999

[54] TRENCH ISOLATED INTEGRATED CIRCUITS INCLUDING VOIDS

[75] Inventor: Sug-hun Hong, Seoul, Rep. of Korea

[73] Assignee: Samsung Electronics Co., Ltd., Suwon, Rep. of Korea

[21] Appl. No.: 08/998,641

[22] Filed: Dec. 29, 1997

[30] Foreign Application Priority Data

Jun. 20, 1997 [KR] Rep. of Korea ...................... 97-26099

[51] Int. Cl.⁶ .................................................. H01L 29/00
[52] U.S. Cl. ........................................... 257/510; 257/622
[58] Field of Search .................................. 257/510, 622; 438/421, 445

[56] References Cited

U.S. PATENT DOCUMENTS

| | | | |
|---|---|---|---|
| 5,387,538 | 2/1995 | Moslehi | 437/67 |
| 5,447,884 | 9/1995 | Fahey et al. | 437/67 |
| 5,691,230 | 11/1997 | Forbes | 438/445 |

OTHER PUBLICATIONS

Nadahara et al., "*Micro Area Stress Around Trench Structure*", Extended Abstracts of the 19th Conference on Solid State Devices and Materials, 1987, pp. 327–330, Dec. 1987.

*Primary Examiner*—Mark V. Prenty
*Attorney, Agent, or Firm*—Myers Bigel Sibley & Sajovec

[57] ABSTRACT

A trench isolated integrated circuit includes at least one void in the trench at the trench corner. The trench comprises a trench wall, a trench floor and a trench corner between the trench wall and the trench floor. An insulating region is included in the trench, including on the trench floor and on the trench wall. The insulating region is spaced apart from the trench corner to define a void at the trench corner. The insulating region may also be spaced apart from a portion of the trench wall, to define a second void on the trench wall that is spaced apart from the void at the trench corner. The voids may reduce stresses cased by the thermal mismatch between the insulating region and the integrated circuit substrate, to thereby improve integrated circuit reliability and/or performance. Methods of forming trench isolated integrated circuits according to invention include the steps of forming a trench in an integrated circuit substrate. The trench comprises a trench wall, a trench floor and a trench corner between the trench wall and the trench floor. A first insulating layer is formed on the trench wall and on the trench floor. A second insulating layer is formed on the first insulating layer opposite the trench wall and spaced apart from the trench floor. The first insulating layer is isotropically etched using the second insulating layer as a mask to form a void in the first insulating layer between the second insulating layer and the trench corner. A third insulating layer is formed on the second insulating layer, opposite the first insulating layer.

9 Claims, 4 Drawing Sheets

5,903,040

TRENCH ISOLATED INTEGRATED CIRCUITS INCLUDING VOIDS

FIELD OF THE INVENTION

This invention relates to isolation structures for integrated circuits and fabrication methods therefor, and more particularly to trench isolation structures for integrated circuits and fabrication methods therefor.

BACKGROUND OF THE INVENTION

Integrated circuits include many active devices in an integrated circuit substrate such as a semiconductor substrate. These active devices are generally isolated from one another. Accordingly, isolation structures and methods are widely used in integrated circuits. One important isolation structure and method is a trench isolation structure and method.

Conventional trench isolation structures are fabricated by forming a trench in an integrated circuit substrate and forming an isolation region of insulating material in the trench. Trench isolation structures and methods are described in U.S. Pat. 5,387,538 to Moslehi entitled *"Method of Fabrication of Integrated Circuit Isolation Structure"* and U.S. Pat. 5,447,884 to Fahey et al. entitled *"Shallow Trench Isolation With Thin Nitride Liner"*.

In conventional trench isolation, defects may be caused due to stresses caused by the difference between the thermal expansion coefficients of the isolation material and the integrated circuit substrate. It has been found that the stresses may be concentrated at the corner of the trench, where the trench wall meets the trench floor. These stresses may impact the reliability and/or performance of the integrated circuit. In order to solve this problem, it has been proposed to round the corner of a trench region. See for example, the publication entitled *"Micro Area Stress around Trench Structure"* to Nadahara et al., Extended Abstracts of the 19$^{th}$ Conference on Solid State Devices and Materials, Tokyo, 1987, pp. 327–330. Notwithstanding this technique, there continues to be a need for trench isolation structures and methods that are capable of reducing stresses in the integrated circuit that are caused by the differences in thermal expansion coefficients between the integrated circuit substrate and the isolation region.

SUMMARY OF THE INVENTION

It is therefore an object of the present invention to provide improved trench isolated integrated circuits and fabrication methods.

It is another object of the present invention to provide trench isolation for integrated circuits that can reduce stress caused by differences in thermal expansion coefficients between the trench and the integrated circuit substrate.

These and other objects are provided, according to the present invention, by a trench isolated integrated circuit that includes at least one void in the trench at the trench corner. In particular, trench isolated integrated circuits according to the invention include an integrated circuit substrate including a trench therein. The trench comprises a trench wall, a trench floor and a trench corner between the trench wall and the trench floor. An insulating region is included in the trench, including on the trench floor and on the trench wall. The insulating region is spaced apart from the trench corner to define a void at the trench corner. The insulating region may also be spaced apart from a portion of the trench wall, to define a second void on the trench wall that is spaced apart from the void at the trench corner. The voids may reduce stresses cased by the thermal mismatch between the insulating region and the integrated circuit substrate, to thereby improve integrated circuit reliability and/or performance.

In a preferred embodiment, the insulating region fills the trench except for the voids. The insulating region preferably comprises a three insulating layer structure. A first insulating layer is included on the trench wall, and spaced apart from the trench floor. A second insulating layer is included on the first insulating layer, opposite the trench wall and extending beyond the first insulating layer towards the trench floor to define the void. A third insulating layer is on the second insulating layer, opposite the first insulating layer. Preferably, the first insulating layer comprises oxide, the second insulating layer comprises nitride, and the third insulating layer comprises oxide. The third insulating layer preferably fills the trench within the second insulating layer.

In another embodiment, the first insulating layer on the trench wall is spaced apart from the trench floor and from the trench opening opposite the trench floor. The second insulating layer is on the first insulating layer opposite the trench wall, and extends beyond the first insulating layer towards the trench floor and towards the trench opening to define the void and the second void. The third insulating layer is included on the second insulating layer, opposite the first insulating layer.

The trench floor may be a flat trench floor such that the void has a flat bottom. Alternatively, the trench floor may a curved trench floor such that the void has a curved bottom. The curved trench floor may be formed using thermal oxidation.

Methods of forming trench isolated integrated circuits according to invention include the steps of forming a trench in an integrated circuit substrate. The trench comprises a trench wall, a trench floor and a trench corner between the trench wall and the trench floor. A first insulating layer is formed on the trench wall and on the trench floor. A second insulating layer is formed on the first insulating layer opposite the trench wall and spaced apart from the trench floor. The first insulating layer is isotropically etched using the second insulating layer as a mask to form a void in the first insulating layer between the second insulating layer and the trench corner. A third insulating layer is formed on the second insulating layer, opposite the first insulating layer.

In another embodiment, the second insulating layer is formed on the first insulating layer opposite the trench wall and spaced apart from both the trench floor and the trench opening. Then, when isotropically etching the first insulating layer, a first void is formed in the first insulating layer between the second insulating layer and the trench corner, and the second void is formed in the first insulating layer between the second insulating layer and the trench wall adjacent the trench opening.

The first insulating layer is preferably a thermal oxide layer. The second insulating layer is preferably a silicon nitride layer. The third insulating layer is preferably an undoped silicon glass layer. The trench floor can be rounded by thermally oxidizing the trench floor after forming the second insulating layer. The third insulating layer may be formed on the integrated circuit substrate including in the trench, and then removed from the integrated circuit substrate, for example by planarizing. The trench may be formed by forming a mask on the integrated circuit substrate and etching the integrated circuit substrate through the mask. Accordingly, trench isolation structures and methods including stress relieving voids are provided.

DETAILED DESCRIPTION OF PREFERRED EMBODIMENTS

Figure 1:
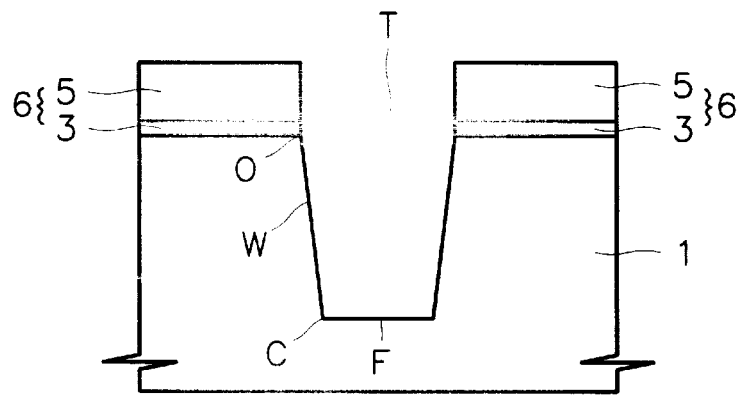
FIGS. 1–4 are cross-sectional views illustrating a first embodiment of trench isolated integrated circuits according to the present invention during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

FIGS. 1–4 are cross-sectional illustrations of trench isolated integrated circuits according to the present invention during intermediate fabrication steps. FIG. 1 illustrates the formation of a trench region T in an integrated circuit substrate 1, such as a semiconductor substrate. As shown, a pad oxide layer and a pad nitride layer are formed on the substrate 1. Then, the pad oxide layer and the pad nitride layer are patterned to form a pad oxide layer pattern 3 and a pad nitride layer pattern 5 that exposes a predetermined portion of the substrate 1. Thus, pad oxide layer pattern 3 and pad nitride layer pattern 5 form a mask 6. The exposed substrate is selectively dry-etched to form the trench region T. As shown in FIG. 1, the trench T includes a trench wall W, a trench floor F, a trench corner C between the trench wall and the trench floor, and a trench opening O opposite the trench floor F.

Figure 2:
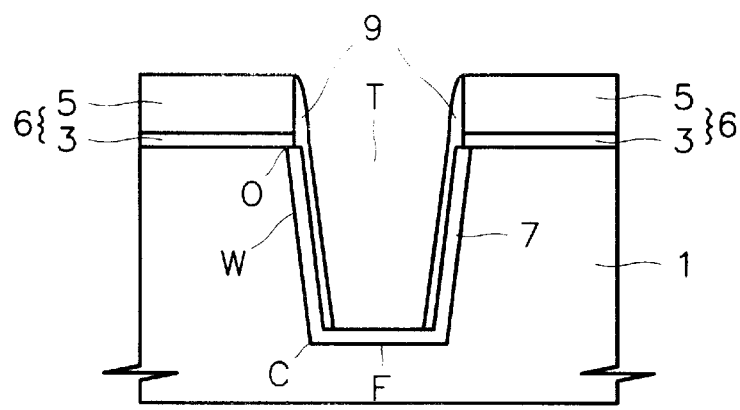

Referring now to FIG. 2, a first insulating layer 7 is formed on the trench wall W and the trench floor F. The first insulating layer 7 may be formed by thermally oxidizing the substrate 1 to form a thermal oxide layer on the walls and on the floor of the trench T.

Continuing with the description of FIG. 2, a second layer, such as a nitride layer, is formed on the substrate 1, including on the first insulating layer 7. The second layer is then anisotropically etched to form a second insulating layer 9 on the first insulating layer 7 opposite the trench wall and spaced apart from the trench floor. Preferably, the second insulating layer 9 does not extend along the trench floor, so that the thermal oxide layer 7 on the trench floor is exposed. As also shown, the second insulating layer 9 also extends onto the walls of the mask 6. Second insulating layer 9 may also be referred to as a spacer.

Figure 3:
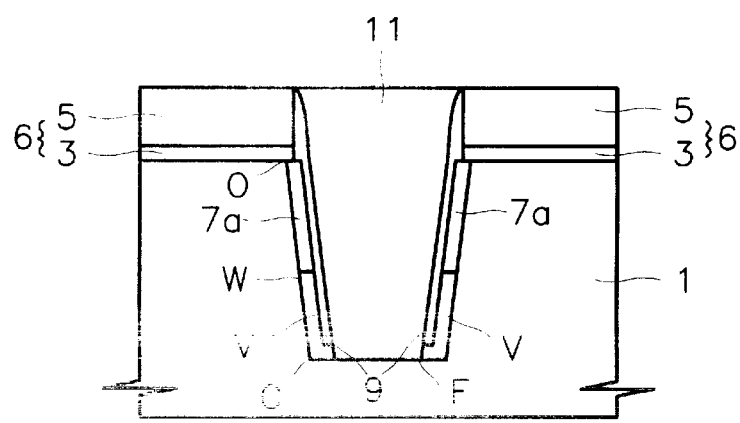

Referring now to FIG. 3, the first insulating layer 7 is isotropically etched using the second insulating layer 9 as a mask, to form a void V in the first insulating layer 7 between the second insulating layer 9 and the trench corner C. The remaining first insulating layer 7 is denoted in FIG. 3 by the reference numeral 7a. The first oxide layer 7 may be isotropically etched by immersing the integrated circuit in an oxide etching solution, such as hydrofluoric acid (HF) solution or Buffered Oxide Etchant (BOE). Thus, the floor F of the trench region T is exposed and the void V is formed between the lower portion of the second insulating layer 9 and the lower portion of the wall of the trench region T.

Still referring to FIG. 3, a third insulating layer 11 is formed on the second insulating layer 9 opposite the first insulating layer 7a. Preferably, the third insulating layer 11 fills the trench, except for the void V at the corner C. The second insulating layer is preferably formed of Undoped Silicate Glass (USG) using a Chemical Vapor Deposition (CVD) process. As shown, the void V is not filled by the third insulating layer 11, but still remains.

Finally, the third insulating layer 11 is planarized, for example using Chemical Mechanical Polishing (CMP) or etching. The void V functions to relieve stress that is applied to the third insulating layer 11 and to the integrated circuit substrate 1 during subsequent thermal processes.

Figure 4:
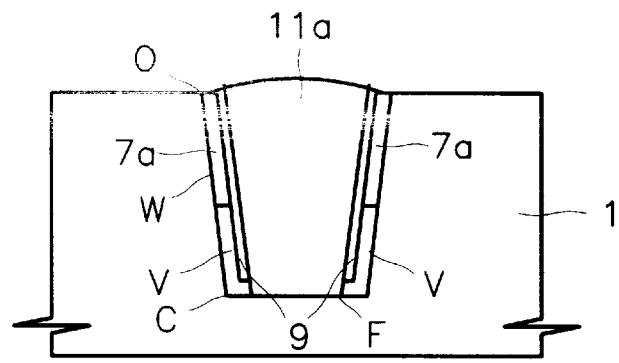

FIG. 4 is a cross-sectional view of the completed isolation structure. The pad nitride layer 5 is removed by immersing the substrate in a nitride etching solution. The pad oxide layer 3 is removed by immersing the substrate in an oxide etching solution. Thus, the substrate 1 is exposed. The third insulating layer 11 may also be etched by the oxide etching solution, so that the final third insulating layer 11a has almost the same height as the top surface of the substrate 1.

Accordingly, the insulating region in the trench includes first insulating layer 7a, second insulating layer 9 and third insulating layer 11a, and includes a void V at the trench corner C. The void can reduce stresses between the isolation region and the substrate that may be caused during subsequent thermal processes. This can prevent crystal defects or other defects.

Figure 5:
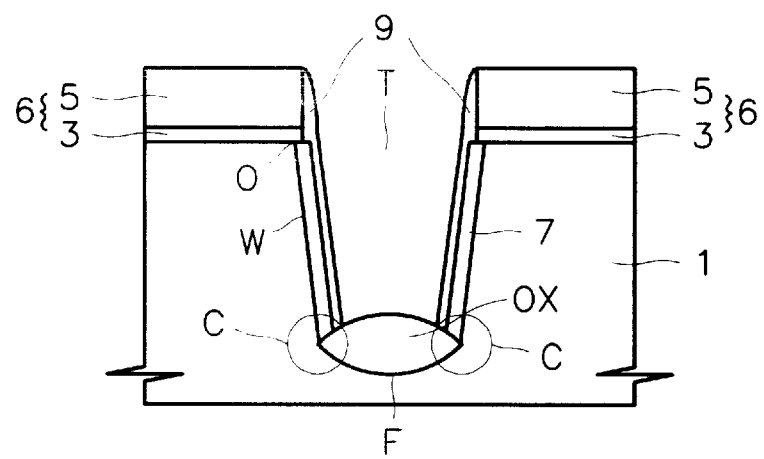
FIGS. 5–7 are cross-sectional views illustrating a second embodiment of trench isolated integrated circuits according to the present invention during intermediate fabrication steps.
Figure 6:
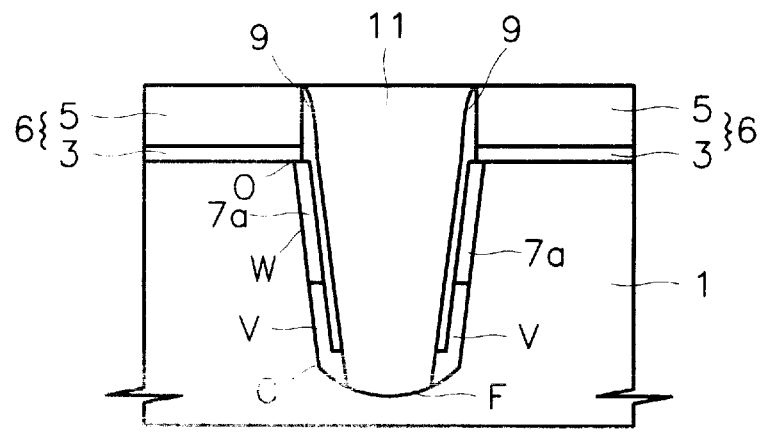
Figure 7:
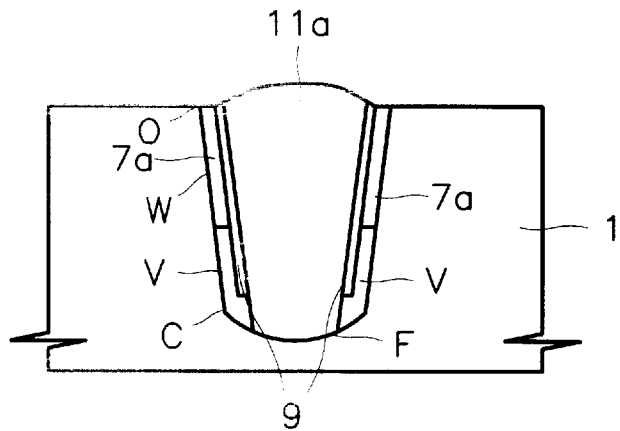

FIGS. 5–7 are cross-sectional views of a second embodiment of the present invention, during intermediate fabrication steps. The steps shown in FIG. 5 to form a trench region T, a first insulating layer 7 and a second insulating layer 9 are similar to those described in connection with FIGS. 1 and 2. Then, still referring to FIG. 5, a sacrificial oxide layer OX is formed on the trench floor F. The sacrificial oxide layer may be formed by thermally oxidizing the substrate to form the sacrificial oxide layer OX that is thicker than thermal oxide layer 7 on the floor of the trench region T. Accordingly, if the sacrificial oxide layer OX is formed, the trench floor is rounded and the corner C of the trench is also rounded. A void that is formed subsequently will therefore have a curved bottom. If the corner C is rounded, more stress may be able to be relieved.

FIG. 6 is a cross-sectional view illustrating the step of forming a void V and a third insulating layer 11. More specifically, as described above, the floor of the trench T is exposed and the first insulating layer 7 is isotropically etched using an oxide etching solution. If the thermal oxide layer 7 is isotropically etched, the void V is formed adjacent the corner C. The sacrificial oxide OX is removed.

Then, a third insulating layer such as Undoped Silicate Glass (USG) is formed on the integrated circuit substrate including filling the trench. The third insulating layer is then planarized using an etchback process or CMP until the mask 6 is exposed, thereby forming the third insulating layer 11 that fills the space within the second insulating layer 9. As shown, the void V functions to relieve stress during subsequent thermal processing.

Finally, as shown in FIG. 7, the mask is removed and the third insulating layer is planarized to form insulating layer 11a that has about the same height as the surface of the integrated circuit substrate. Accordingly, the rounded voids V may relieve stress during subsequent thermal processes.

Figure 8:
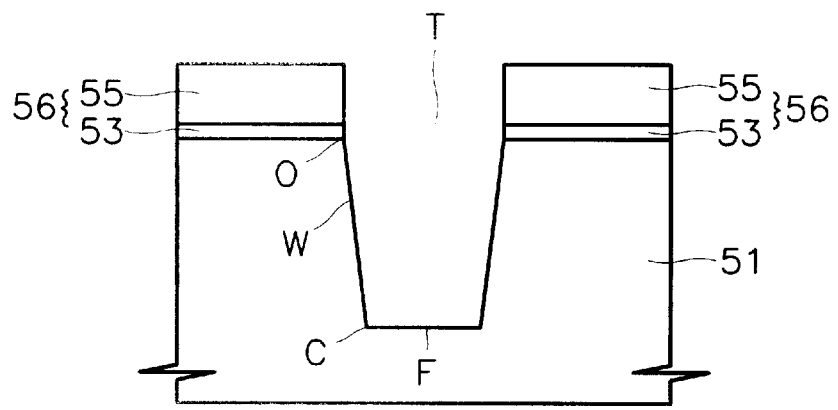
FIGS. 8–11 are cross-sectional views illustrating a third embodiment of trench isolated integrated circuits according to the present invention during intermediate fabrication steps.
Figure 9:
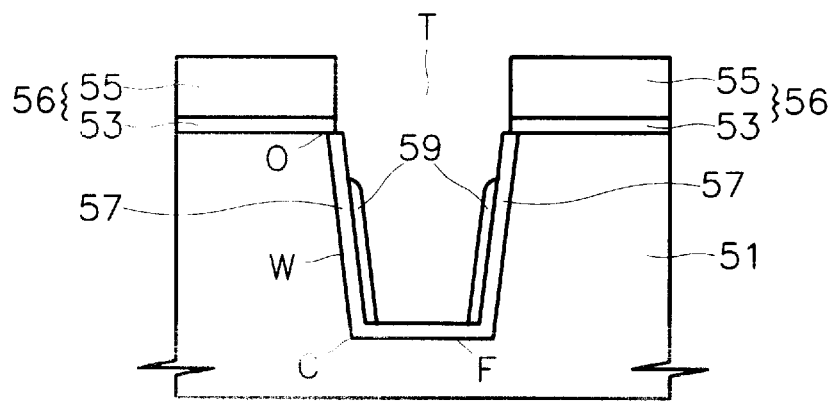

FIGS. 8–11 are cross-sectional views illustrating a third embodiment of the present invention during intermediate fabrication steps. As shown in FIG. 8, a mask 56 and the trench region T are formed using a pad oxide layer 53 and a pad nitride layer 55, as was described above. As shown in FIG. 9, a first insulating layer 57 is formed on the trench wall and on the trench bottom. The first insulating layer 57 may also cure etching damage which is caused when forming the trench region T. Then, a second insulating layer is formed on the integrated circuit substrate and on the first insulating layer 57. The second insulating layer is anisotropically etched to form a second insulating layer 59 on the first insulating layer 57 opposite the trench wall and spaced apart from the trench floor IF and the trench opening O. It will be understood that during anisotropic etching to form the second insulating layer 59, overetching is preferably performed to expose the first insulating layer at the trench opening O.

Figure 10:
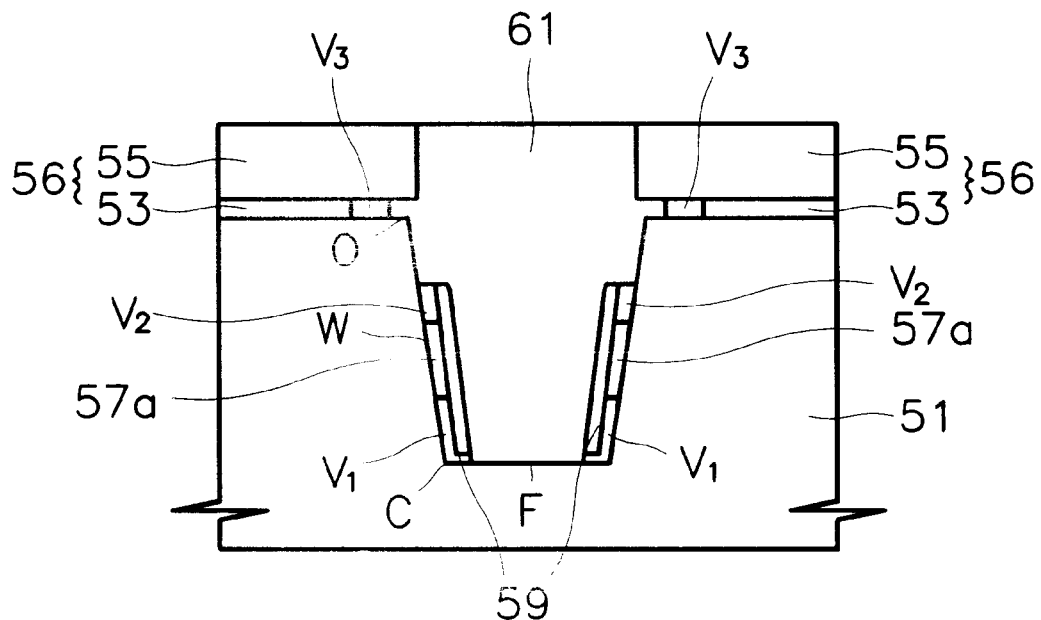

As shown in FIG. 10, a first void $V_1$ and a second void $V_2$ are formed in the first insulating layer, between the second insulating layer 59 and the trench corner and between the second insulating layer 59 and the trench wall adjacent the trench opening O, respectively. The voids may be formed by isotropically etching the first insulating layer 57 in an oxide etching solution such as HF solution or BOE. The first insulating layer 57 is isotropically etched so that the remaining first insulating layer 57a is spaced apart from the trench floor and the trench opening and the second insulating layer 59 extends beyond the first insulating layer 57a towards the trench floor and towards the trench opening, to define the first void $V_1$ and the second void $V_2$. The pad oxide layer pattern 53 is also isotropically etched to form third void $V_3$.

Still referring to FIG. 10, a third insulating layer such as Undoped Silicate Glass (USG) is formed on the integrated circuit substrate including in the trench. The voids are not filled by the third insulating layer. The third insulating layer is then planarized to form a third insulating layer 61 that fills the trench.

Figure 11:
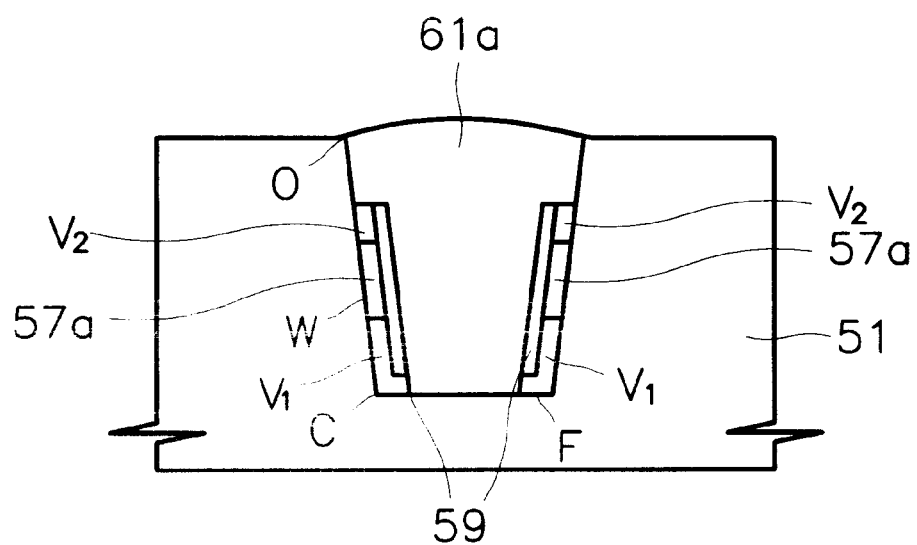

Finally, referring to FIG. 11, the mask 56 is removed and the third insulating layer 61 is etched to form a second insulating layer 61a having about the same height as the surface of the integrated circuit substrate.

Thus, voids are formed at the corner and opening of the trench. Stresses formed at these locations may thereby be relieved during subsequent thermal processes. This can prevent crystal defects from occurring at the walls and at the floor of the trench region, to thereby improve reliability and/or performance of the integrated circuit.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A trench isolated integrated circuit comprising:
   an integrated circuit substrate including a trench therein, the trench comprising a trench wall, a trench floor and a trench corner between the trench wall and the trench floor; and
   an insulating region in the trench including on the trench floor and on the trench wall, the insulating region being spaced apart from the trench corner to define a void at the trench corner, the void extending from the trench corner onto the trench floor.

2. A trench isolated integrated circuit comprising:
   an integrated circuit substrate including a trench therein, the trench comprising a trench wall, a trench floor and a trench corner between the trench wall and the trench floor; and
   an insulating region in the trench including on the trench floor and on the trench wall, the insulating region being spaced apart from the trench corner to define a first void at the trench corner:
   the insulating region also being spaced apart from a portion of the trench wall to define a second void on the trench wall that is spaced apart from the void at the trench corner.

3. A trench isolated integrated circuit comprising:
   an integrated circuit substrate including a trench therein, the trench comprising a trench wall, a trench floor and a trench corner between the trench wall and the trench floor; and
   an insulating region in the trench including on the trench floor and on the trench wall, the insulating region being spaced apart from the trench corner to define a void at the trench corner;
   wherein the insulating region fills the trench except for the void.

4. A trench isolated integrated circuit comprising:
   an integrated circuit substrate including a trench therein, the trench comprising a trench wall, a trench floor and a trench corner between the trench wall and the trench floor; and
   an insulating region in the trench including on the trench floor and on the trench wall, the insulating region being spaced apart from the trench corner to define a void at the trench corner;
   wherein the insulating region comprises:
      a first insulating layer on the trench wall, and spaced apart from the trench floor;
      a second insulating layer on the first insulating layer opposite the trench wall, and extending beyond the first insulating layer towards the trench floor to define the void; and
      a third insulating layer on the second insulating layer, opposite the first insulating layer.

5. A trench isolated integrated circuit according to claim 4 wherein the third insulating layer fills the trench within the second insulating layer.

6. A trench isolated integrated circuit according to claim 4 wherein the first insulating layer comprises oxide, wherein the second insulating layer comprises nitride and wherein the third insulating layer comprises oxide.

7. A trench isolated integrated circuit according to claim 2 wherein the trench further comprises a trench opening opposite the trench floor, and wherein the insulating region comprises:
   a first insulating layer on the trench wall, and spaced apart from the trench floor and the trench opening;
   a second insulating layer on the first insulating layer opposite the trench wall, and extending beyond the first insulating layer towards the trench floor and towards the trench opening to define the first void and the second void; and a third insulating layer on the second insulating layer, opposite the first insulating layer.

8. A trench isolated integrated circuit comprising:

an integrated circuit substrate including a trench therein, the trench comprising a trench wall, a trench floor and a trench corner between the trench wall and the trench floor; and an insulating region in the trench including on the trench floor and on the trench wall, the insulating region being spaced apart from the trench corner to define a void at the trench corner;

wherein the trench floor is a flat trench floor such that the void has a flat bottom.

9. A trench isolated integrated circuit comprising:

an integrated circuit substrate including a trench therein, the trench comprising a trench wall, a trench floor and a trench corner between the trench wall and the trench floor; and an insulating region in the trench including on the trench floor and on the trench wall, the insulating region being spaced apart from the trench corner to define a void at the trench corner;

wherein the trench floor is a curved trench floor such that the void has a curved bottom.

\* \* \* \* \*